US006762094B2

(12) United States Patent
Stasiak et al.

(10) Patent No.: US 6,762,094 B2
(45) Date of Patent: Jul. 13, 2004

(54) NANOMETER-SCALE SEMICONDUCTOR DEVICES AND METHOD OF MAKING

(75) Inventors: James Stasiak, Lebanon, OR (US); Jennifer Wu, Corvallis, OR (US); David E Hackleman, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 16 days.

(21) Appl. No.: 10/256,984

(22) Filed: Sep. 27, 2002

(65) Prior Publication Data

US 2004/0061151 A1 Apr. 1, 2004

(51) Int. Cl.$^7$ .............. H05K 3/36; G02B 5/32; H01L 21/8242
(52) U.S. Cl. .............. 438/257; 438/961; 438/962; 29/830; 29/831; 264/1.31
(58) Field of Search ............... 438/257–267, 438/962, 961, 166, 598, 745, 746, 754, 597, 706, 708; 257/20, 23, 24; 365/154, 175, 156; 29/830, 831; 427/533; 492/30; 264/1.31

(56) References Cited

U.S. PATENT DOCUMENTS

| | | | | |
|---|---|---|---|---|
| 4,272,744 A | * | 6/1981 | Schuegraf | 333/249 |
| H000157 H | * | 11/1986 | Smith | 257/25 |
| 5,138,408 A | * | 8/1992 | Ando | 257/134 |
| 5,285,081 A | * | 2/1994 | Ando | 257/24 |
| 5,475,341 A | * | 12/1995 | Reed | 327/566 |
| 5,772,905 A | | 6/1998 | Chou | |
| 5,937,295 A | * | 8/1999 | Chen et al. | 438/257 |
| 5,990,516 A | * | 11/1999 | Momose et al. | 257/327 |
| 6,069,380 A | | 5/2000 | Chou et al. | |
| 6,090,666 A | * | 7/2000 | Ueda et al. | 438/257 |
| 6,103,540 A | * | 8/2000 | Russell et al. | 438/22 |
| 6,128,216 A | * | 10/2000 | Noble et al. | 365/154 |
| 6,153,534 A | * | 11/2000 | Long et al. | 438/745 |
| 6,165,911 A | | 12/2000 | Calveley | |
| 6,168,979 B1 | * | 1/2001 | Kim et al. | 438/151 |
| 6,190,929 B1 | | 2/2001 | Wang et al. | |
| 6,197,641 B1 | | 3/2001 | Hergenrother et al. | |
| 6,248,674 B1 | | 6/2001 | Kamis et al. | |
| 6,256,767 B1 | * | 7/2001 | Kuekes et al. | 716/9 |
| 6,261,938 B1 | * | 7/2001 | Beauvais et al. | 438/607 |
| 6,294,450 B1 | * | 9/2001 | Chen et al. | 438/597 |
| 6,319,566 B1 | * | 11/2001 | Polanyi et al. | 427/533 |
| 6,348,388 B1 | | 2/2002 | Faltermeier et al. | |
| 6,375,870 B1 | | 4/2002 | Visovsky et al. | |

(List continued on next page.)

OTHER PUBLICATIONS

Vieu–C et al. "Electron Beam lithography, resolution limits and appplications", Surface Science in MIcrp and NAnotechnology, Applied Surface Science vol. 164, p.111–117, Sep. 01, 2000.*

Hirai Y. et al. <"Nano–imprint lithography for single elctron tunneling devices using novel mold" Japan Sioc. Appl. PHys., IEEE Electron Device Soc., pp. 122–123, 1999.*

Hirai Y et al. <"Novel mold fabrication for nao–imprint lithography to fabricate single–electrom tunneling devices", Japanese Journal of Applied Physics– Part –!, vol. 38, No. 128, pp. 7272–7275, Dec. 1999.*

(List continued on next page.)

*Primary Examiner*—Wael Fahmy
*Assistant Examiner*—Shrinivas H. Rao
(74) *Attorney, Agent, or Firm*—Donald J. Coulman

(57) ABSTRACT

A semiconductor device including a substrate having a dopant of a first polarity, a first semiconducting structure including a dopant of a second polarity disposed over the substrate, and having substantially planar top and side surfaces. The semiconductor device includes a first junction, formed between the first semiconducting structure and the substrate, having an area wherein at least one lateral dimension is less than about 75 nanometers.

22 Claims, 17 Drawing Sheets

U.S. PATENT DOCUMENTS

| | | | |
|---|---|---|---|
| 6,518,156 B1 * | 2/2003 | Chen et al. | 438/597 |
| 6,518,189 B1 * | 2/2003 | Chou | 438/706 |
| 6,534,414 B1 * | 3/2003 | Wang et al. | 438/709 |
| 6,544,846 B2 * | 4/2003 | Ahn et al. | 438/257 |
| 6,559,648 B2 * | 5/2003 | Baumgaertl et al. | 324/424 |
| 2002/0008280 A1 | 1/2002 | Armacost et al. | |
| 2002/0060338 A1 | 5/2002 | Zhang | |

OTHER PUBLICATIONS

Hirai– Y et al. "Nano chamber fabrication on acrylic palte by direct nano imprint lithography using quartz mold", 2001 Int'l conference. pp. 104–105.*

Otto– M et al. "Characterization and application of a UV–based imprint technique" Microelectronic Engeneering ( Netherlands), vol. 57–58, pp. 361–366, Sep. 2001.*

Beck–M et al., "Improving nanoimprint Lithography stamps for 10nm features", Proceedings of the 2001 $1^{st}$ IEEE Conference on NAnotechnology, IEEE–Nano 2001, Muai, HI, USa, pp. 17–22, 2001.*

* cited by examiner

NANOMETER-SCALE SEMICONDUCTOR DEVICES AND METHOD OF MAKING

BACKGROUND

1. Description of the Art

Over the past few years, the demand for ever cheaper and lighter weight portable electronic devices has led to a growing need to manufacture durable, lightweight, and low cost electronic circuits of increasing complexity, including high density memory chips. To a large extent, over the past thirty years, this growth has been fueled by a nearly constant exponential increase in the capabilities of microelectronic devices; producing unprecedented advances in computational, telecommunication, and signal processing capabilities. In turn, this increase in complexity has driven a corresponding decrease in the feature size of integrated circuit devices, which has typically followed "Moore's Law." However, the continued decrease in feature size of integrated circuits, into the nanometer regime, has become increasingly more difficult, and may be approaching a limit, because of a combination of physical and economic reasons.

Prior proposed solutions to the problem of constructing nanometer-scale devices have typically fallen into two broad categories, one general area can be described as new patterning techniques, the other general area involves new materials having nanometer-scale dimensions. New patterning techniques include both projection systems utilizing radiation, and direct write systems utilizing particle beams, or scanning probes. Some of the newer higher resolution projection systems require expensive radiation sources such as synchrotrons. On the other hand direct write systems, typically, require a serial process of individually writing each structure in contrast to exposing many structures at one time utilizing projection systems. Thus, direct write systems, typically, have a much lower throughput when compared to projection systems again leading to either increased complexity in manufacturing or increased cost or both.

Recently new materials having semiconducting properties and nanometer-scale dimensions have been synthesized and fabricated into nanometer-scale devices. However, after these nanometer-scale materials are formed, they are often randomly arranged, either one end randomly attached to a substrate or both ends free. This randomness along with the difficulty of physically manipulating nanometer-sized components presents a significant challenge to the fabrication of reproducible and practical nanometer-scale devices.

If these problems persist, the continued growth, seen over the past several decades, in cheaper, higher speed, higher density, and lower power integrated circuits used in electronic devices will be impractical.

DESCRIPTION OF THE PREFERRED EMBODIMENTS

The invention provides for the design and fabrication of semiconductor junctions and bipolar junction transistors having nanometer scale junction dimensions. The present invention does not require a process for physically aligning an array of semiconductor nanowires, formed ex-situ, over an array of previously physically aligned nanowires to fabricate a diode or bipolar junction transistor. The present invention allows both the material and dopant to be optimized for each layer providing a process for optimizing the diode or bipolar transistor performance.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although some of the embodiments illustrated wherein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Figure 1:
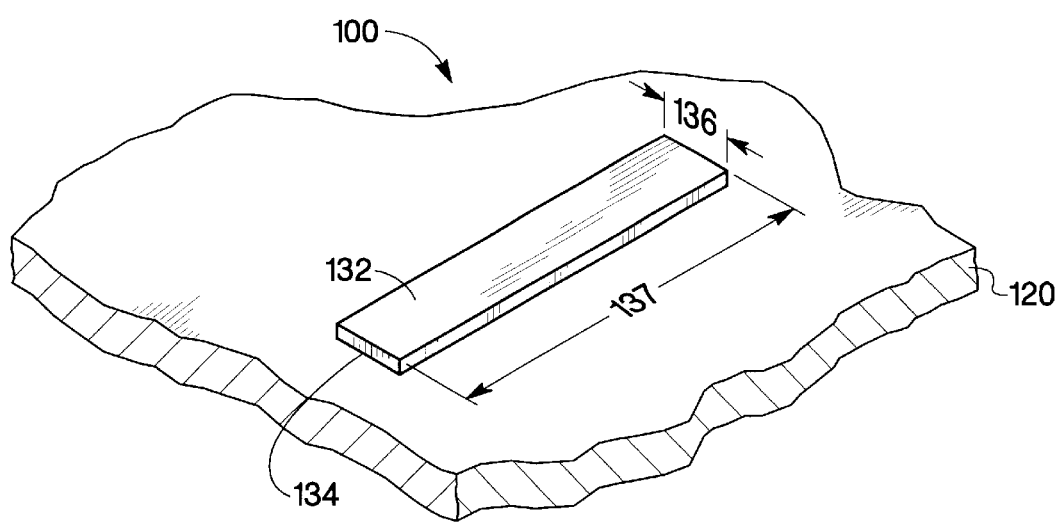
FIG. 1 is a perspective view of a semiconductor junction according to an embodiment of the present invention.

FIG. 1 is an illustration of an exemplary embodiment of the present invention in the form of a semiconductor junction. Substrate 120, and first semiconducting structure 132 form diode 100. In this embodiment, substrate 120 is a semiconductor wafer including a dopant of a first polarity that is either p or n doped at a specified concentration. The particular dopant material and the dopant concentration will depend on various factors, such as the junction dimensions as well as the particular application in which the device will be used. In this embodiment, first semiconducting structure 132 is an epitaxial layer, however, in alternate embodiments, diode 100 may utilize, for example, semiconducting structures formed from polycrystalline or amorphous layers. First semiconducting structure 132 includes a dopant of a second polarity (e.g. a complementary dopant to that of substrate 120), and may be formed from a semiconducting thin film disposed over substrate 120 using conventional semiconductor processing equipment. In this embodiment, first semiconducting structure 132 has substantially planar top and side surfaces, however, in alternate embodiments, other structures may also be utilized. In this embodiment, first structure 132 has a thickness in the range from about 1.0 nanometer to about 75 nanometers. In alternate embodiments, first structure 132 may have a thickness in the range from about 1.0 nanometers to 1,000 nanometers. First structure 132 is doped using a dopant of opposite polarity as that used in substrate 120, wherein opposite polarity is defined in terms of acceptor and donor dopants being opposite in polarity (e.g. the dopant of a first polarity may be n and then the dopant of the second polarity is p). The interface between epitaxial structure 132 and substrate 120 forms first junction 134 having either a pn or np junction, depending on the particular dopant utilized in substrate 120. In addition, junction 134 includes an area formed by length 137 and width 136 wherein at least one lateral dimension is less than about 75 nanometers. According to alternate embodiments, semiconducting junction 134 has an area wherein at least one lateral dimension is less than about 50 nanometers. Preferably junction 134 has an area defined at the interface of less than about 15,000 square nanometers and more preferably less than about 5,000 square nanometers. Semiconducting junction 134 provides on the order of 10 Tera devices/cm$^2$, and depending on the particular application in which the device will be used, the a real density of devices, in alternate embodiments, may range from about 0.2 Tera devices/cm$^2$ to about 10.0 Tera devices/cm$^2$.

Figure 2A:
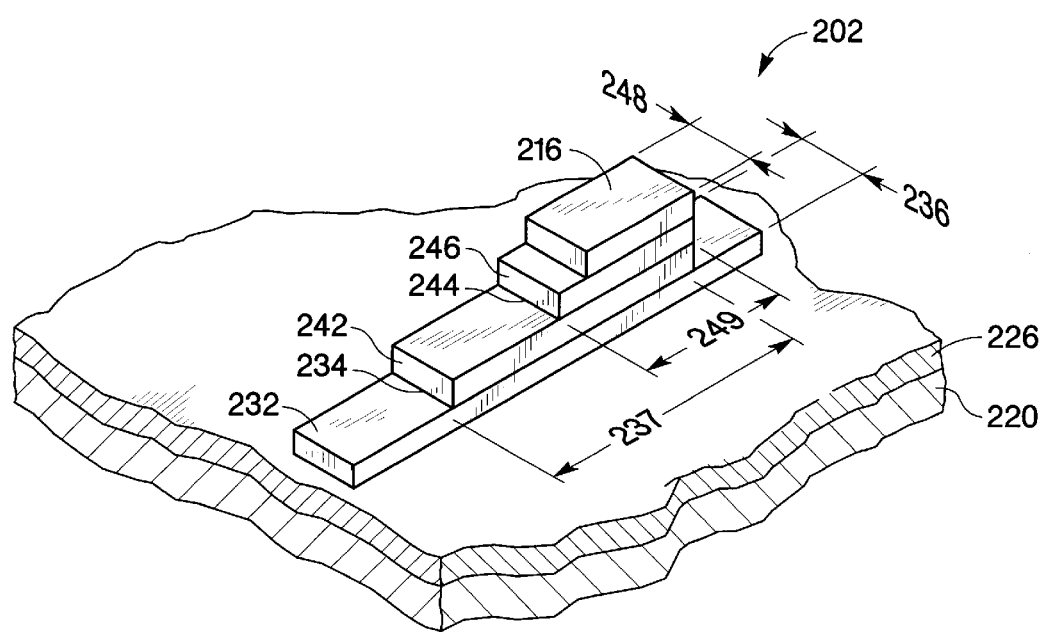
FIG. 2a is a perspective view of a bipolar junction transistor according to an embodiment of the present invention.

FIG. 2a is an illustration of an exemplary embodiment of the invention in the form of bipolar junction transistor 202 formed by first semiconducting layer 232, base epitaxial semiconducting layer 242, and second semiconducting layer 246 all disposed over substrate 220. In this embodiment, substrate 220 is a conventional silicon semiconductor wafer with dielectric layer 226 disposed between substrate 220 and semiconducting layers 232, 242, and 246. Dielectric layer 226 may include, for example, a buried oxide layer or a semiconductor on insulator structure. In alternate embodiments, substrate 220 may be any of a wide range of materials, such as, gallium arsenide, germanium, glass, sapphire, and indium phosphide to name a few examples.

Epitaxial thin films are utilized to create semiconducting layers 232, 242, and 246, and are formed using conventional semiconductor processing equipment. First semiconducting layer 232 includes a specified dopant and dopant concentration and is formed between substrate 220 and base epitaxial semiconducting layer 242. The particular dopant material and the dopant concentration will depend on various factors, such as the junction dimensions as well as the particular application the device will be used in. Base epitaxial semiconducting layer 242, or the epitacxial semiconducting base layer used to form the base structure, includes a dopant of a first polarity, that is of opposite polarity as that used in first semiconducting layer 232. First semiconducting layer 232 includes a dopant of a second polarity. In this embodiment, base epitaxial layer 242 has a thickness in the range from about 1.0 nanometer to about 75 nanometers. In alternate; embodiments, base epitaxial layer 242 may have a thickness in the range from about 1.0 nanometers to 1,000 nanometers. The interface between first semiconducting layer 232 and base epitaxial layer 242 forms first semiconducting junction 234 having either a pn or np junction depending on the particular dopant utilized in first semiconducting layer 232. In addition, first junction 234 includes an area formed by length 237 and width 236 wherein at least one lateral dimension is less than about 75 nanometers. In alternate embodiments, first junction 234 has an area wherein at least one lateral dimension is less than about 50 nanometers. Preferably first junction 234 has an area defined at the interface of less than about 15,000 square nanometers and more preferably less than about 5,000 square nanometers.

Second semiconducting junction 244 is formed between base epitaxial semiconducting layer 242 and second semiconducting layer 246. Second semiconducting layer 246 has the same dopant polarity as that of first semiconducting layer 232 and is formed over base epitaxial semiconducting layer 242. However, second semiconducting layer 246 may have a different dopant material as compared to first semiconducting layer 232 as well as a differing dopant concentration. Second junction 244 includes an area formed by length 249 and width 248 wherein at least one lateral dimension is less than about 75 nanometers. In alternate embodiments, second junction 244 has an area wherein at least one lateral dimension is less than about 50 nanometers. Preferably, second junction 234 has an area defined at the interface of less than about 15,000 square nanometers and more preferably less than about 5,000 square nanometers. In this embodiment, bipolar junction transistor 202 forms a vertically aligned bipolar transistor. In addition, in this embodiment, the base, collector and emitter elements can be doped to the appropriate levels individually. For example, first semiconducting layer 232 may be p doped forming the emitter of the bipolar transistor and the collector (i.e. second semiconducting layer 246) heavily p doped (i.e. p++) with an n doped base (i.e. base epitaxial layer 242) forming a pnp bipolar transistor, thus, providing a structure for optimizing the transistor performance. In addition, in an alternate embodiment first semiconducting layer 232 and base epitaxial layer 242 may be utilized to form a diode similar to that described in FIG. 1. Further, first and second epitaxial semiconducting layers 232 and 246 as well as base epitaxial layer 244, in alternate embodiments, may utilize any combination of semiconducting layers. The first and second layers, for example, may be created from a polycrystalline layer and the base layer from an epitaxial layer. Another example is where the first layer may be created from an epitaxial layer with the base layer created from a polycrystalline layer and the second layer from an amorphous layer.

Figure 2B:
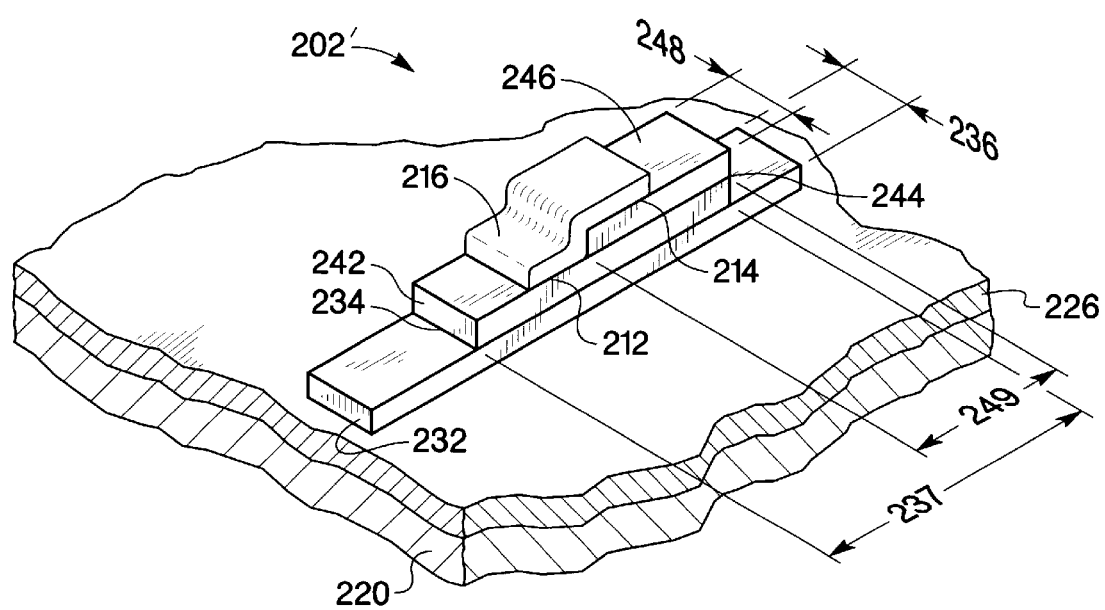
FIG. 2b is a perspective view of a Schottky diode clamped bipolar junction transistor according to an alternate embodiment of the present invention.

Electrical contact 216 is formed over a portion of second semiconducting layer 246 to provide electrical routing of signals utilized by the electronic device in which bipolar transistor 202 is located. Electrical contacts to epitaxial layer 232 and base epitaxial layer 242 have not been shown. In addition, in alternate embodiments, electrical contact 216 may be formed from an electrically conductive layer wherein electrical contact 216 forms Schottky barrier 214 to second epitaxial structure 246 and the electrically conductive layer further forms ohmic contact 212 to a portion of base epitaxial semiconducting layer 242 forming Schottky diode clamped bipolar junction transistor 202' as shown in FIG. 2b. Such a Schottky diode clamped bipolar junction transistor may also be formed, in still other embodiments, by utilizing the electrically conductive layer to form an ohmic contact to a portion of base epitaxial semiconducting layer 242 and a Schottky barrier contact to a portion of first semiconducting layer 232.

Figure 3:
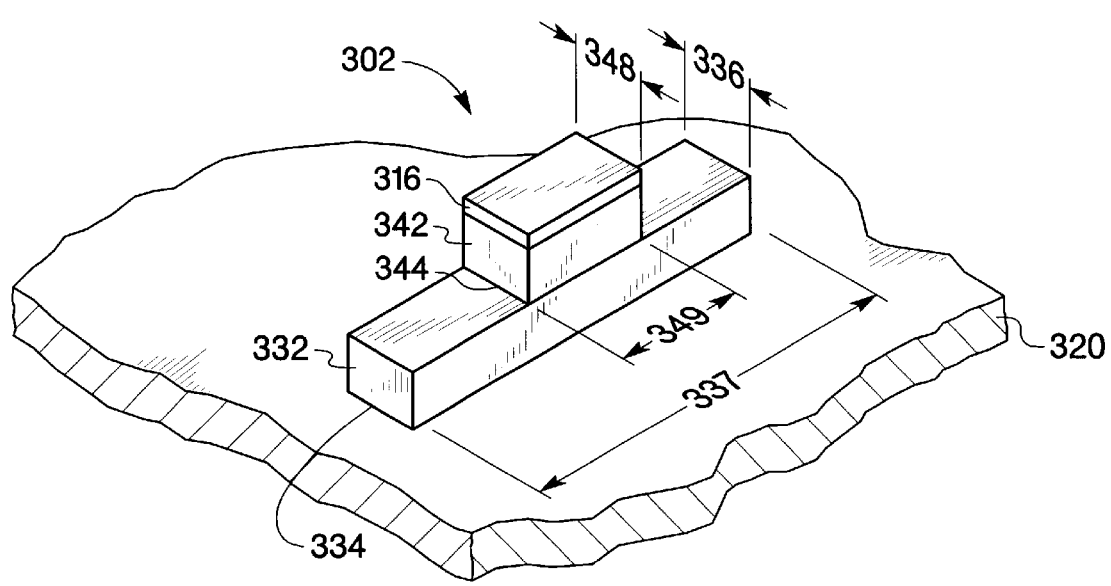
FIG. 3 is a perspective view of a bipolar junction transistor according to an alternate embodiment of the present invention.

FIG. 3 is an illustration of an alternate embodiment of the invention in the form of bipolar junction transistor 302 comprising doped semiconductor wafer 320, first semiconducting structure 332, and second semiconducting structure 342. In this embodiment, substrate 320 is a semiconductor wafer, is either p or n doped, and forms either the emitter or collector of bipolar junction transistor 302. In this embodiment, substrate 320 is a conventional doped wafer having a specified dopant and dopant concentration wherein the dopant is designated as a dopant of a first polarity. The particular dopant material and the dopant concentration will depend on various factors, such as the junction dimensions as well as the particular application in which the device will be used. Substrate 320, in alternate embodiments, may be any of a wide range of semiconductor materials, such as silicon, gallium arsenide, germanium, and indium phosphide to name a few examples.

A semiconducting thin film is disposed on substrate 320 using conventional semiconductor processing equipment. The semiconducting thin film is utilized to create first semiconducting structure 332 having substantially planar top and side surfaces. In this embodiment, first semiconducting structure 332 is an epitaxial semiconducting layer, however, alternate embodiments, may utilize any of the widely available semiconducting layers such as amorphous or polycrystalline layers to form the semiconducting thin film. First structure 332 is doped using a dopant of opposite polarity (e.g. complementary dopant), as that used in substrate 320 and is designated a dopant of a second polarity. The interface between first structure 332 and substrate 320 forms first semiconducting junction 334 having either a pn or np junction depending on the particular dopant utilized in substrate 320. In addition, first junction 334 includes an area formed by length 337 and width 336 wherein at least one lateral dimension, in the plane formed by junction 334 is less than about 75 nanometers. In alternate embodiments, first junction 334 has an area wherein at least one lateral dimension is less than about 50 nanometers. In alternate embodiments, first junction 334 has an area defined at the interface of less than about 15,000 square nanometers and more preferably less than about 5,000 square nanometers.

Second semiconducting junction 344 is formed between second semiconducting structure 342 and first structure 332. Second semiconducting structure 342 has the same dopant polarity as that of substrate 320 (e.g. a dopant of the first polarity). However, second semiconducting structure 342 may have a different dopant material as compared to substrate 320 as well as a differing dopant concentration. In this embodiment, second semiconducting structure 342 is formed from a polycrystalline thin film formed on first semiconducting structure 332. Second semiconducting structure 342 has substantially planar top and side surfaces. In addition, in alternate embodiments, second semiconducting structure 342 may utilize an amorphous or epitaxial thin film. Second junction 344 includes an area formed by length 349 and width 348 wherein at least one lateral dimension is less than about 75 nanometers. In alternate embodiments, second junction 344 has an area wherein at least one lateral dimension is less than about 50 nanometers. In still other embodiments, second junction 344 has an area defined at the interface of less than about 15,000 square nanometers and more preferably less than about 5,000 square nanometers.

In addition, in this embodiment, the base, collector and emitter elements can be doped to the appropriate levels individually. For example, the wafer may be p doped forming the emitter of the bipolar transistor and the collector (i.e. second structure 342) heavily p doped (i.e. p++) with an n doped base (i.e. first structure 332) forming a pnp bipolar transistor, providing a process for optimizing the transistor performance. Electrical contact 316 is formed over a portion of second semiconducting structure 342 to provide electrical routing of signals utilized by the electronic device in which bipolar transistor 302 is located. Electrical contacts to first structure 332 and substrate 320 have not been shown.

Figure 4A:
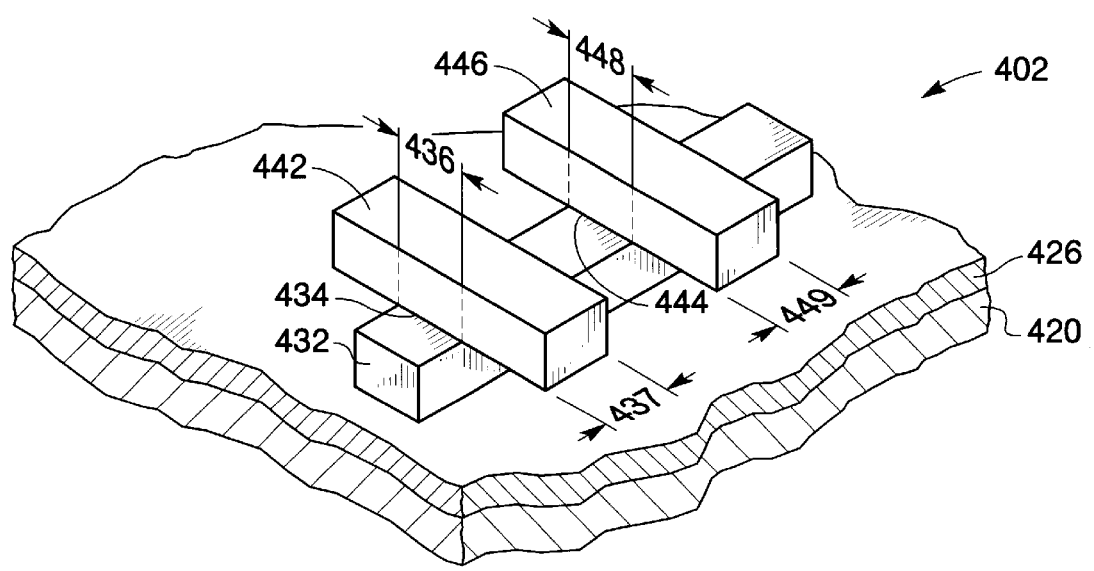
FIG. 4a is a perspective view of a bipolar junction transistor according to an alternate embodiment of the present invention.

An alternate embodiment of the present invention is shown in an perspective view in FIG. 4a. In this embodiment, epitaxial semiconducting structure 432, first polycrystalline semiconducting structure 442, and second polycrystalline semiconducting structure 446 form bipolar junction transistor 402. Epitaxial semiconducting structure 432, first polycrystalline semiconducting structure 442, and second polycrystalline semiconducting structure 446 have substantially planar top and side surfaces. Epitaxial semiconducting structure 432, including a dopant, is formed on dielectric layer 426 that is disposed over substrate 420. The epitaxial semiconducting thin film, utilized to create epitaxial semiconducting structure 432, as well as dielectric layer 426, are created using conventional semiconductor processing equipment. In this embodiment, substrate 420 is a conventional silicon wafer with a silicon dioxide layer formed on the wafer as dielectric layer 426. Substrate 420, in alternate embodiments, may be any of a wide range of materials, gallium arsenide, germanium, sapphire, and glass are just a few examples. The particular material utilized will depend on various factors, such as the junction dimensions and the particular application in which the transistor will be used. The particular dopant material and the dopant concentration of epitaxial semiconducting structure 432, also, will depend on various factors, such as the junction dimensions as well as the particular application in which the device will be used.

Polycrystalline semiconducting structure 442 and second polycrystalline semiconducting structure 446 are formed over epitaxial structure 432. Polycrystalline structures 442 and 446 each include a dopant of opposite polarity than that of epitaxial structure 432 (e.g. structures 442 and 446 may be p doped and then epitaxial structure 432 is n doped). In this embodiment, polycrystalline structures 442 and 446 may have differing dopant materials. In addition, polycrystalline structures 442 and 446 may also have differing dopant concentrations. In utilizing various combinations of dopant materials and concentrations the performance of the bipolar junction transistor 402 may be optimized. Further, in an alternate embodiment, first polycrystalline semiconducting structure 442 and second polycrystalline semiconducting structure 446 can be crystalline semiconducting nanowires grown ex-situ and physically aligned over epitaxial semiconducting structure 432 to also form bipolar junction transistor 402.

The interface between epitaxial structure 432 and polycrystalline structure 442 forms first semiconducting junction 434 having either a pn or np junction depending on the particular dopant utilized in epitaxial structure 432. In addition, first junction 434 includes an area formed by length 437 and width 436 wherein at least one lateral dimension is less than about 75 nanometers. In alternate embodiments, first junction 434 has an area wherein at least one lateral dimension is less than about 50 nanometers. In still other embodiments, first junction 434 has an area defined at the interface of less than about 15,000 square nanometers and more preferably less than about 5,000 square nanometers.

Second semiconducting junction 444 is formed between second polycrystalline semiconducting structure 446 and epitaxial structure 432. Second polycrystalline semiconducting structure 446 has the same dopant polarity as that of first polycrystalline structure 442. Second junction 444 includes an area formed by length 449 and width 448 wherein at least one lateral dimension is less than about 75 nanometers. In alternate embodiments, second junction 444 has an area wherein at least one lateral dimension is less than about 50 nanometers. In still other embodiments, second semiconducting junction 444 has an area defined at the interface of less than about 15,000 square nanometers and more preferably less than about 5,000 square nanometers. Thus, the junctions formed between polycrystalline structures 442, and 446 and epitaxial structure 432 form bipolar junction transistor 402. Bipolar junction transistor 402 provides on the order of 10 Tera transistors/cm². In addition, in this embodiment, the base, collector and emitter elements can be doped to the appropriate levels individually. For example, the polycrystalline structure 442 may be p doped forming the emitter of the bipolar transistor, second polycrystalline structure 446, forming the collector, may be heavily p doped (i.e. p++) with an n doped base forming a pnp bipolar transistor.

Figure 4B:
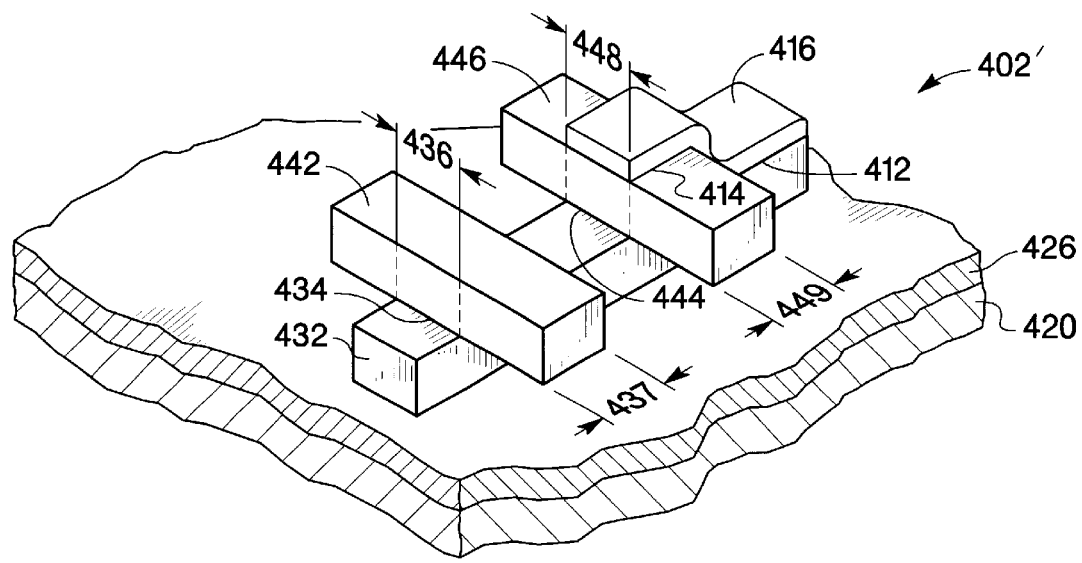
FIG. 4b is a perspective view of a bipolar junction a Schottky diode clamped bipolar junction transistor according to an alternate embodiment of the present invention.
Figure 4C:
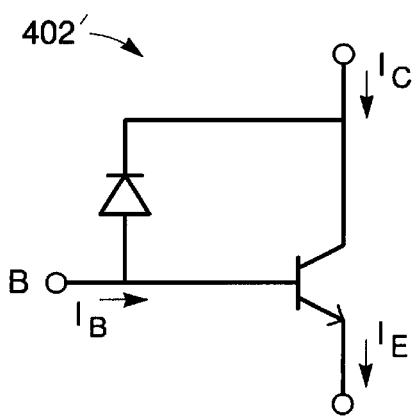

Referring to FIG. 4b, an alternate embodiment of the present invention is shown where electrical contact 416 is utilized to form Schottky diode clamped bipolar junction transistor 402'. In this embodiment, electrical contact 416 is formed from an electrically conductive layer wherein electrical contact 416 forms Schottky barrier 414 to second polycrystalline structure 446 and the electrically conductive layer further forms ohmic contact 412 to epitaxial structure 432. Such a Schottky diode clamped bipolar junction transistor may also be formed, in still other embodiments, by utilizing the electrically conductive layer to form an ohmic contact to a portion of epitaxial semiconducting structure 432 and a Schottky barrier contact to a portion of first polycrystalline structure 442.

Figure 5A:
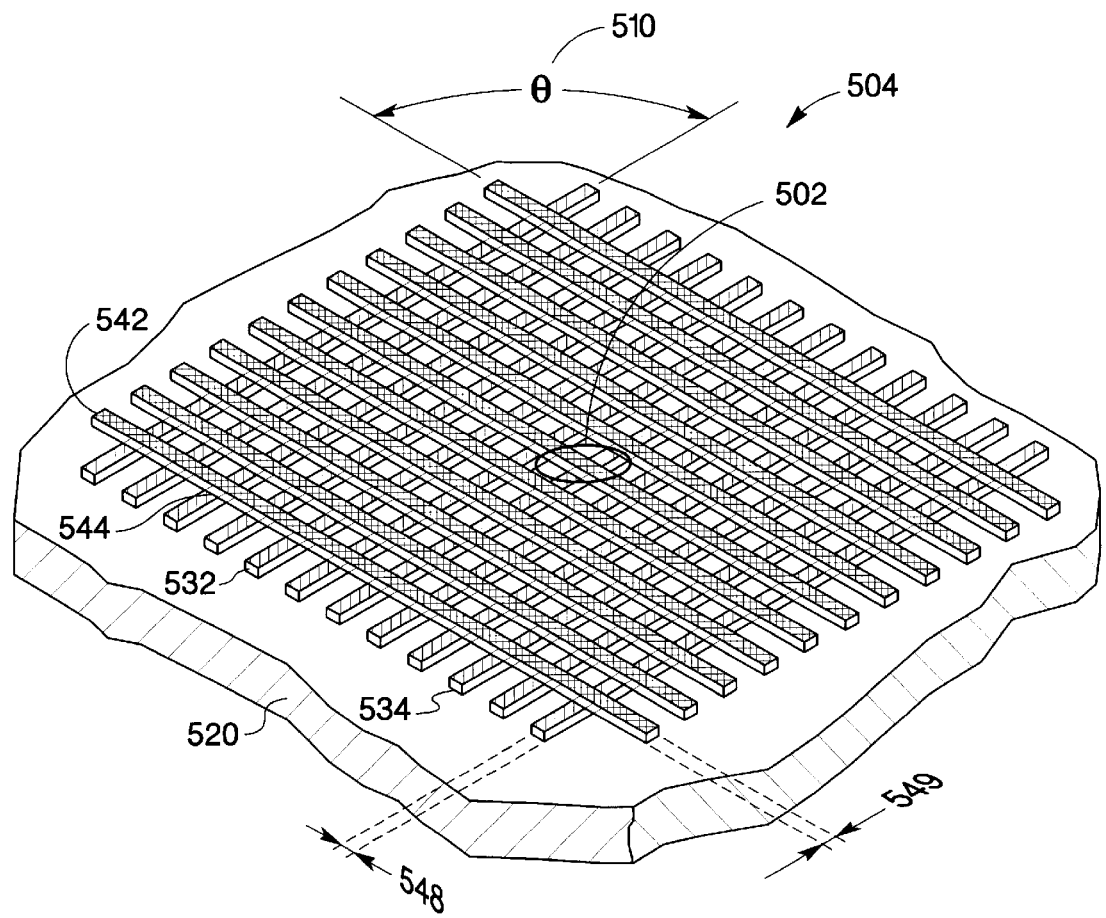
FIG. 5a is a perspective view of an array of bipolar junction transistors according to an embodiment of the present invention.
Figure 5B:
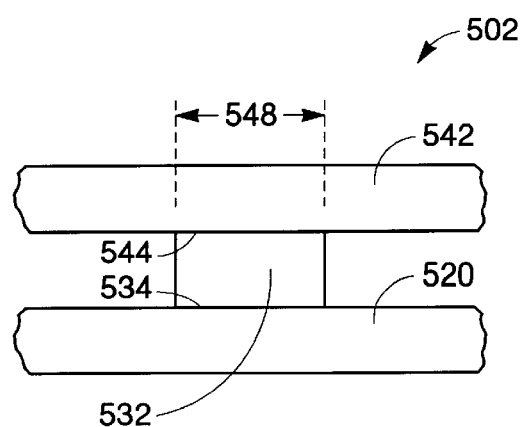
FIG. 5b is a cross-sectional view of one of the bipolar junction transistors from the array shown in FIG. 5a according to an embodiment of the present invention.

An alternate embodiment of the present invention is shown in a perspective view in FIG. 5a. In this embodiment, a plurality of epitaxial semiconducting base lines 532, a plurality of first semiconducting lines 542 and doped semiconductor wafer 520 form an array of bipolar junction transistors 504. Substrate 520 is a semiconductor wafer, that is either p or n doped at a specified concentration and forms either the emitter or collector of bipolar junction transistor 502 as shown in FIG. 5b. The particular dopant material and the dopant concentration will depend on various factors, such as the junction dimensions as well as the particular application in which the device will be used. The epitaxial thin film, used to create epitaxial semiconducting base lines 532, is formed on substrate 520 using conventional semiconductor processing equipment. Epitaxial semiconducting base lines 532 are substantially parallel to each other and epitaxial base lines 532 are doped using a dopant of opposite polarity as that used in substrate 520. The interface between epitaxial base lines 532 and substrate 520 forms first semiconducting junction 534 having either a pn or np junction depending on the particular dopant utilized in substrate 520.

In addition, first junction 534 includes width 548 less than about 75 nanometers as shown in FIGS. 5a and 5b. In alternate embodiments first junction 534 includes width 548 less than about 50 nanometers.

Second semiconducting junction 544 is formed between first semiconducting lines 542 and epitaxial base lines 532. First semiconducting lines 542 have the same dopant polarity as that of substrate 520. The semiconducting thin film, used to create first semiconducting lines 542, is formed on epitaxial base lines 532 using conventional semiconductor processing equipment. In this embodiment first semiconducting lines 542 are polycrystalline semiconducting lines. In alternate embodiments, first semiconducting lines may be formed from other thin films such as amorphous semiconducting thin films. First semiconducting lines 542 are substantially parallel to each other and form a predetermined angle 510 to epitaxial lines 532. In alternate embodiments, angle 510 is between about 20 degrees and about 90 degrees. More preferably angle 510 is about 90 degrees such that first semiconducting lines 542 and epitaxial lines 532 are substantially mutually orthogonal.

Second junction 544 includes an area formed by length 549 shown in FIG. 5a and width 548 shown in FIG. 5b wherein at least one lateral dimension is less than about 75 nanometers. In alternate embodiments, second semiconducting junction 544 has an area wherein at least one lateral dimension is less than about 50 nanometers. In still other embodiments, second semiconducting junction 544 has an area defined at the interface of less than about 15,000 square nanometers and more preferably less than about 5,000 square nanometers. First and second junctions 534 and 544 provides on the order of 10 Tera transistors/cm², and depending on the particular application in which the device will be used, the areal density of devices, in alternate embodiments, may range from about 0.2 Tera transistors/cm² to about 10.0 Tera transistors/cm²

Further, in alternate embodiments epitaxial base lines 532 and first semiconducting lines 542 may each have a length (not shown) greater than about 10 microns. In still other embodiments, epitaxial base lines 532 and first semiconducting lines 542 each may have a length (not shown) greater than about 100 microns. In addition, in this embodiment, the base, collector and emitter elements can be doped to the appropriate levels individually. For example, the wafer can be n-doped forming the emitter of the bipolar transistor and the collector heavily n-doped (i.e. n++) with a p-doped base forming a npn bipolar transistor.

Figure 5C:
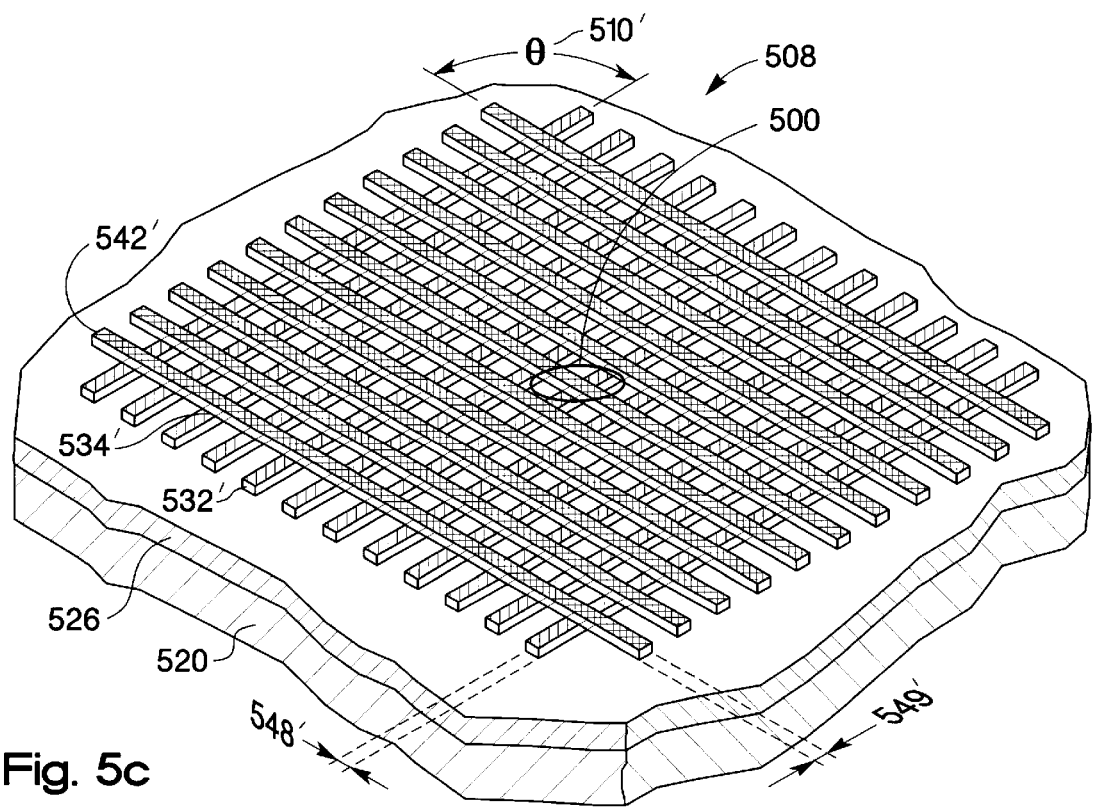
FIG. 5c is a perspective view of array of diodes according to an embodiment of the present invention.

An alternate embodiment of the present invention is shown in a perspective view in FIG. 5c. In this embodiment, a plurality of first semiconducting lines 532', a plurality of second semiconducting lines 542' are formed on dielectric layer 526 creating diode array 508. In this embodiment substrate 520' is a conventional silicon wafer with a silicon dioxide layer formed on the wafer as dielectric layer 526. Substrate 520', in alternate embodiments, may be any of a wide range of materials, gallium arsenide, germanium, sapphire, and glass are just a few examples. The particular material utilized will depend on various factors, such as the junction dimensions and the particular application in which diode array 508 is utilized.

Semiconducting junction 534' is formed between first semiconducting lines 532' and second semiconducting lines 542' forming diode 500. First semiconducting lines 532' are doped with a dopant of a first polarity. First semiconducting thin film, utilized to create first semiconducting lines 532', is formed on substrate 520' using conventional semiconductor processing equipment and are substantially parallel, to each other. Second semiconducting lines 542' are doped with a dopant of a second polarity and are formed on first semiconducting lines 532'. Second semiconducting lines 542' are substantially parallel to each other and form a predetermined angle 510' to first semiconducting lines 532'. In alternate embodiments, angle 510' is between about 20 degrees and about 90 degrees. In still other embodiments, angle 510' is about 90 degrees such that second semiconducting lines 542 and first semiconducting lines 532' are substantially mutually orthogonal.

Semiconducting junction 534' has length 549' and width 548' wherein at least one lateral dimension is less than about 75 nanometers. In alternate embodiments, semiconducting junction 534' has an area wherein at least one lateral dimension is less than about 50 nanometers. In still other embodiments, junction 534' has an area defined at the interface of less than about 15,000 square nanometers and more preferably less than about 5,000 square nanometers. Junction 534' provides on the order of 10 Tera diodes/cm$^2$, and depending on the particular application in which the device will be used, the areal density of diodes, in alternate embodiments, may range from about 0.2 Tera diodes/cm$^2$ to about 10.0 Tera diodes/cm$^2$.

Figure 5D:
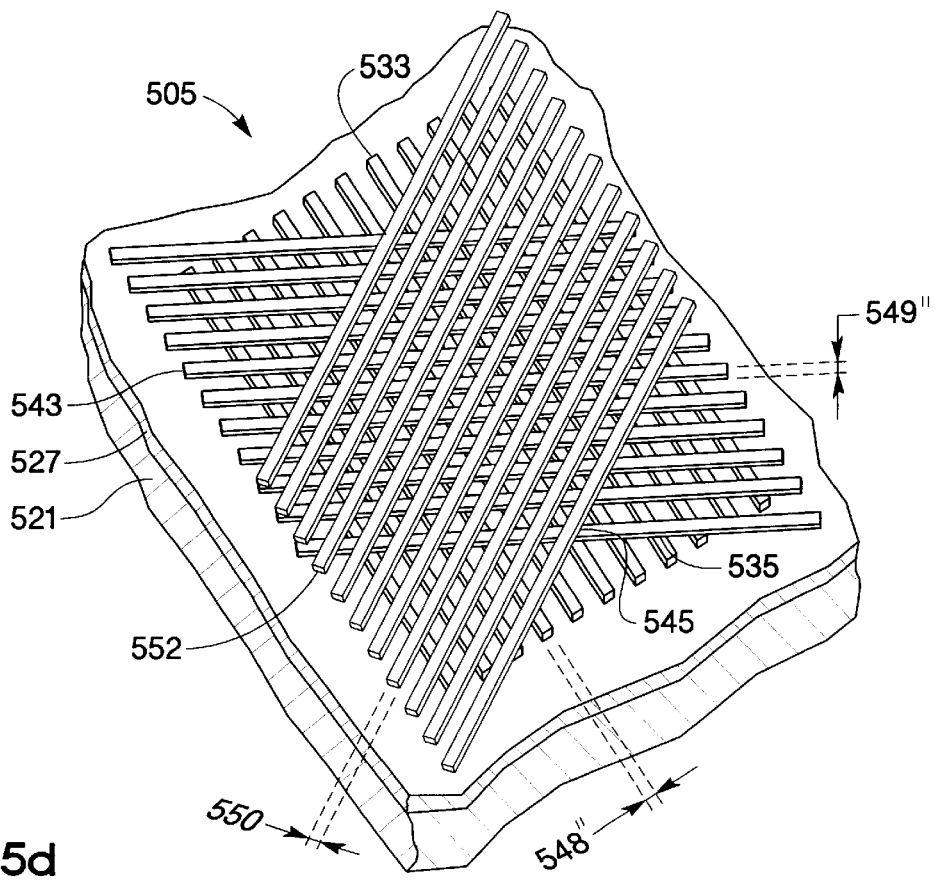
FIG. 5d is a perspective view of an array of bipolar junction transistors according to an alternate embodiment of the present invention.

An alternate embodiment of the present invention is shown in a perspective view in FIG. 5d. In this embodiment, a plurality of epitaxial semiconducting lines 533, a plurality of second semi conducting lines 543, and a plurality of third semiconducting lines 552 are formed over dielectric layer 527 creating a hexagonal array of bipolar junction transistors 505. In alternate embodiments, the plurality of epitaxial semiconducting lines 533, of second semiconducting lines 543, and of third semiconducting lines 552 may be formed at a predetermined angle other than 60 similar to that shown in FIG. 5a. In this embodiment, substrate 521 is a conventional silicon wafer with a silicon dioxide layer formed on the wafer as dielectric layer 527. Dielectric layer 527 may include, for example, a buried oxide layer or a semiconductor on insulator structure. Substrate 521, in alternate embodiments, may be any of a wide range of materials, gallium arsenide, germanium, sapphire, and glass are just a few examples. The particular material utilized will depend on various factors, such as the junction dimensions and the particular application in which the array is utilized.

Epitaxial semiconducting lines 533 are either p or n doped having the desired dopant and dopant concentration, and form either the emitter or collector of the bipolar junction transistor. The particular dopant material and the dopant concentration will depend on various factors, such as the junction dimensions as well as the particular application the transistor array will be used in. The epitaxial thin film, used to create epitaxial semiconducting lines 533, is formed on dielectric layer 527 using conventional semiconductor processing equipment. Epitaxial semiconducting lines 533 are substantially parallel to each other. Second semiconducting lines 543 are doped using a dopant of opposite polarity as that used in epitaxial semiconducting lines 533. The interface between epitaxial lines 533 and second semiconducting lines 543 forms first junction 535 having either a pn or np junction depending on the particular dopant utilized in epitaxial semiconducting lines 533. In addition, first junction 535 includes an area formed by a length (not shown) and width 548" wherein at least one lateral dimension is less than about 75 nanometers. In alternate embodiments, first junction 535 includes an area formed by a length (not shown) and width 548" wherein at least one lateral dimension is less than about 50 nanometers.

Second semiconducting junction 545 is formed between second and third semiconducting lines 543 and 552. Third semiconducting lines 552 are formed over second semiconducting lines 543, and are doped with a dopant of the same polarity as that used in epitaxial semiconducting lines 533. In this embodiment, second and third semiconducting lines 543 and 552 are polycrystalline lines, however, in other embodiments, other types of semiconductor lines may also be utilized, such as amorphous lines. Second junction 545 includes a length (not shown) and width 549", wherein at least one lateral dimension is less than about 75 nanometers. In alternate embodiments, second junction 535 includes a length (not shown) and width 549" less than about 50 nanometers.

Figure 6:
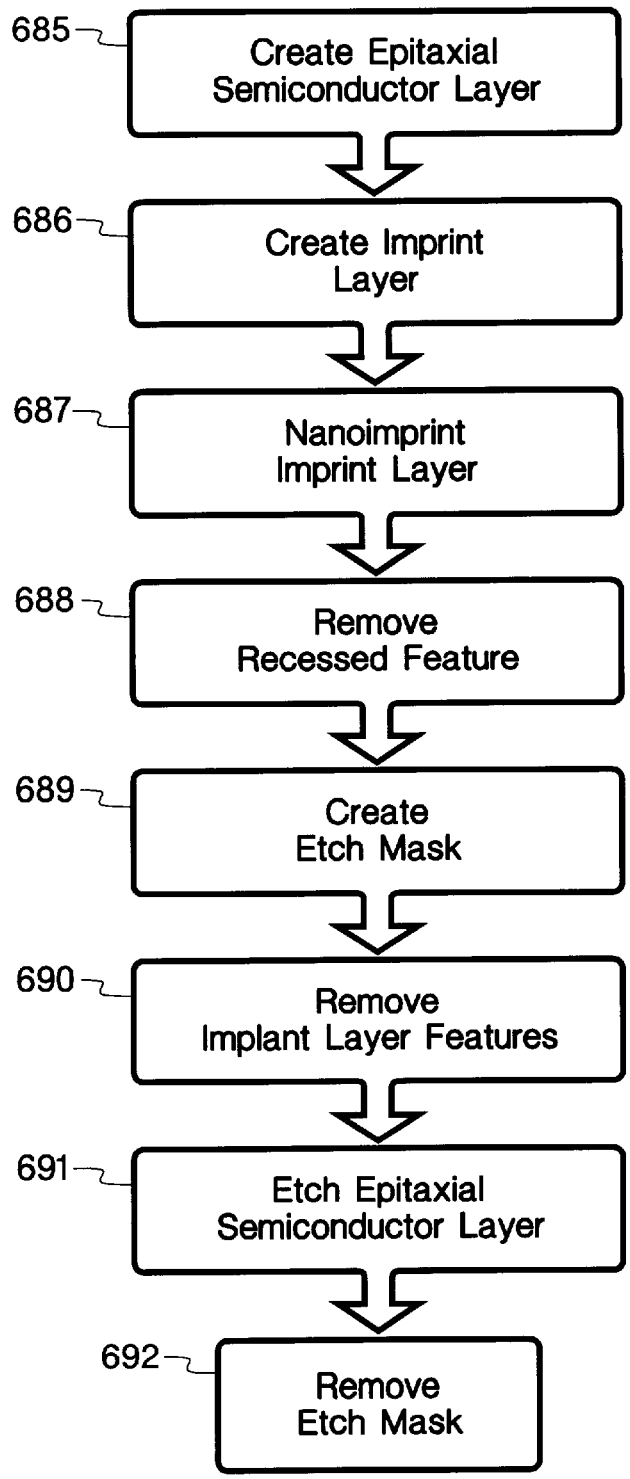
FIG. 6 is an exemplary flow chart of a process used to create a semiconductor junction according to an embodiment of the present invention.
Figure 7:
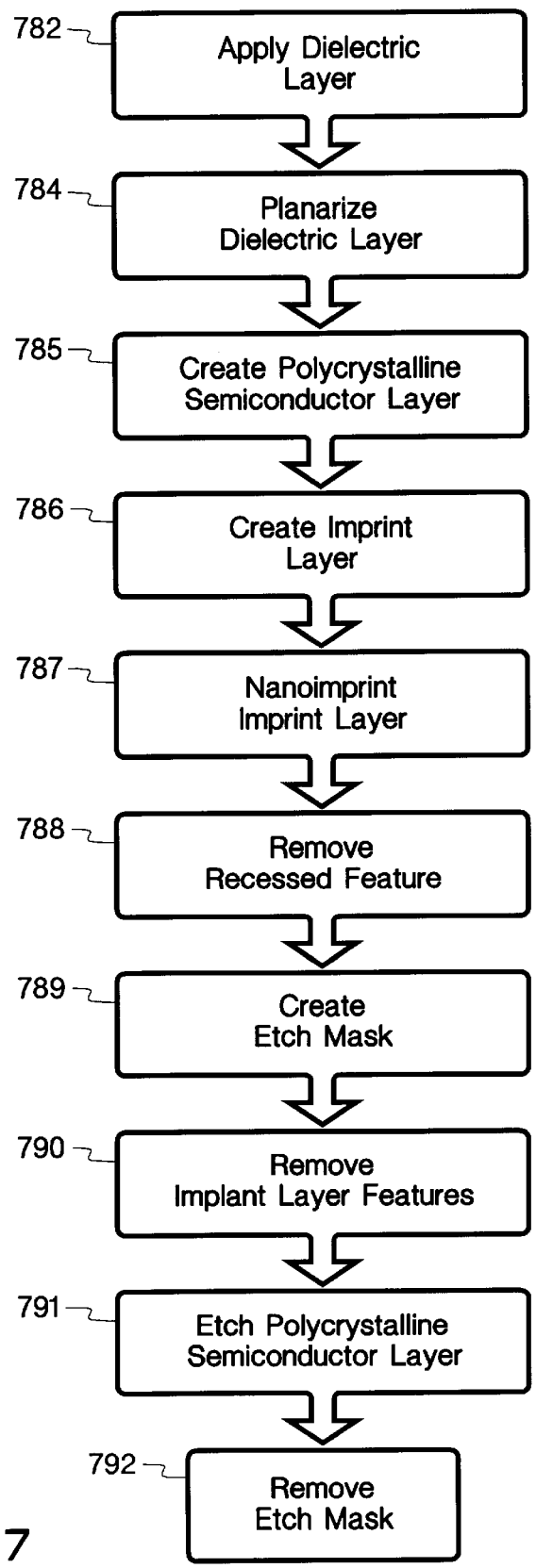
FIG. 7 is an exemplary flow chart of a process used to create a bipolar junction transistor according to an embodiment of the present invention.

FIGS. 6 and 7 are exemplary process flow charts used to create exemplary embodiments of the invention. FIGS. 8a–8h and 9a–9j are exemplary illustrations of the processes utilized to create a diode or bipolar junction transistor, and are shown only to better clarify and understand the invention. Actual dimensions are not to scale and some features are exaggerated to more clearly point out the process.

Figure 8A:
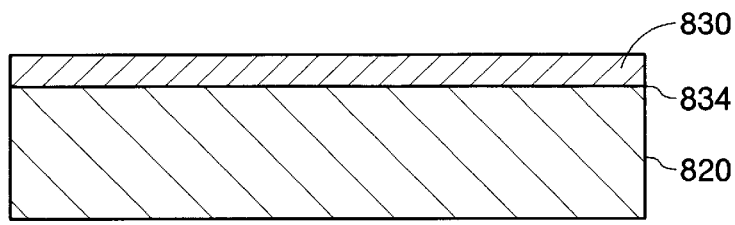
FIGS. 8a–8h are exemplary cross-sectional views of various processes used to create embodiments of the present invention.

Referring to FIG. 8, epitaxial process 685 is utilized to create epitaxial semiconducting layer 830 over doped semiconductor substrate 820 (see FIG. 8a). Epitaxial semiconducting layer 830 includes a dopant of a first polarity, opposite in polarity to the dopant contained in semiconductor substrate 820, forming semiconductor junction 834 (see FIG. 8a). In this embodiment, epitaxial semiconducting layer 830 is an n or p doped epitaxial silicon thin film formed, using conventional semiconductor processing equipment, on a complementary doped silicon wafer having a dopant of opposite polarity to that utilized in the epitaxial layer. In this embodiment, epitaxial semiconducting layer 830 has a thickness in the range from about 1.0 nanometers to about 75.0 nanometers. In alternate embodiments the thickness of the epitaxial layer may range from about 1.0 nanometers to about 1,000 nanometers. And still in other embodiments epitaxial semiconducting layer 830 may be a doped epitaxial silicon layer, which has a thickness less than about 75 nanometers. In alternate embodiments, substrate 820 may be any of a wide range of materials, such as, gallium arsenide, germanium, glass, sapphire, and indium phosphide to name a few examples. In still other embodiments, substrate 820 may also include a dielectric layer formed the substrate and the epitaxial semiconducting layer. In such embodiments the dielectric layer may include, for example, a buried oxide layer or a semiconductor on insulator structure.

Figure 8B:
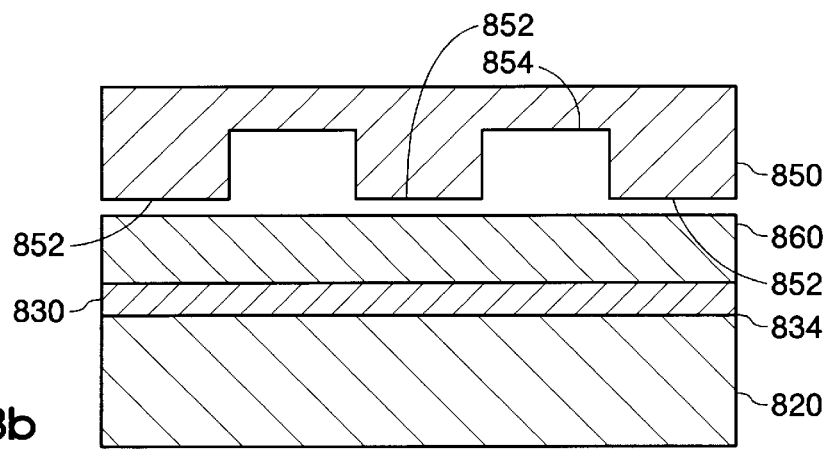

Imprint application process 686 is utilized to form or create imprint layer 860 on epitaxial semiconducting layer 830 (see FIG. 8b). The imprint layer may be applied utilizing any of the appropriate techniques such as spin coating, vapor deposition, spray coating or ink jet deposition to name just a few examples. In one embodiment, imprint layer 860 (see FIG. 8b) is a polymethyl methacrylate (PMMA) spin coated onto epitaxial semiconducting layer 830. Imprint layer 860 may be any moldable Material. That is any material that either flows or is pliable under a first condition and relatively solid and less pliable under a second condition may be utilized. Examples of nonpolymeric materials that may be utilized, for the imprint layer, are metals and metal alloys having melting points below the temperature at which either the substrate or epitaxial layer would be degraded or damaged. Typically, for polymeric imprint layers a low temperature bake process is utilized to drive off any excess solvent that may remain after the layer is applied.

Figure 8C:
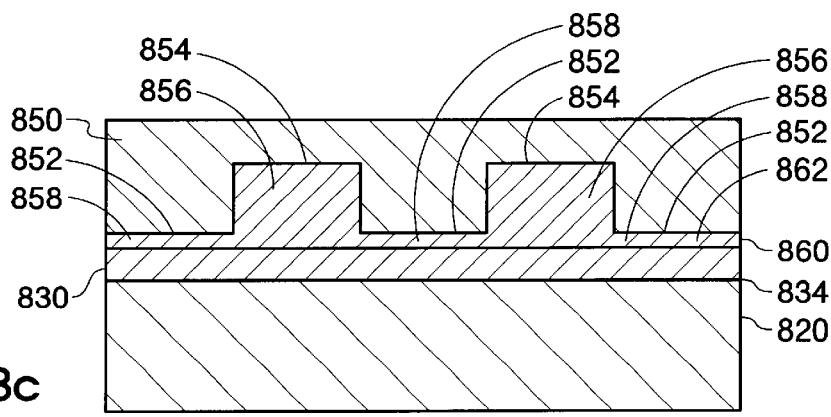
Figure 8D:
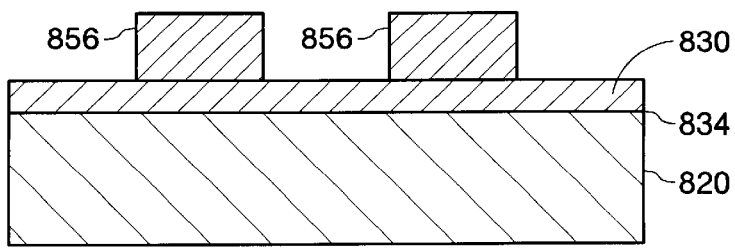

Nanoimprinting process 687 is used to imprint the desired structures or features into imprint layer 860 (see FIG. 8c).

Nanoimprinter 850 is pressed or urged toward imprint layer 860 under a condition in which the imprint layer is pliable. For example, heating a PMMA layer above its softening or glass transition temperature. Nanoimorinter 850 (see FIG. 8b) includes features or structures having a substantially complementary shape to that desired to be formed in imprint layer 860. The desired structures of nanoimprinter 850 are represented by protrusions 852 and indentations 854 as shown, in the simplified schematic, in FIG. 8b. By complementary, it is meant that the pattern formed in imprint layer 860 (see FIG. 8c) has a shape corresponding to the complement of the pattern formed in nanoimprinter 850 (see FIG. 8b). That is protrusion 852 on the nanoimprinter forms recessed feature 858 (see FIG. 8c) and indentation 854 forms raised feature 856 (see FIG. 8c). The particular temperature and pressure utilized in nanoimprinting process 687 will depend on various parameters such as the size and shape of the features being molded and the specific materials used for the imprint layer.

Recessed feature removing process 688 is utilized to remove recessed features 858 (see FIG. 8c) formed during nanoimprinting. Recessed feature removing process 688 may be accomplished by any wet or dry etch process appropriate for the particular material utilized for the imprint layer. For example, to remove residual PMMA 862 that forms recessed feature 858 (see FIG. 8c) an oxygen plasma etching process or what is generally referred to as a reactive ion etch can be utilized, exposing the underlying epitaxial semiconductor layer 830 (see FIG. 8d).

Figure 8E:
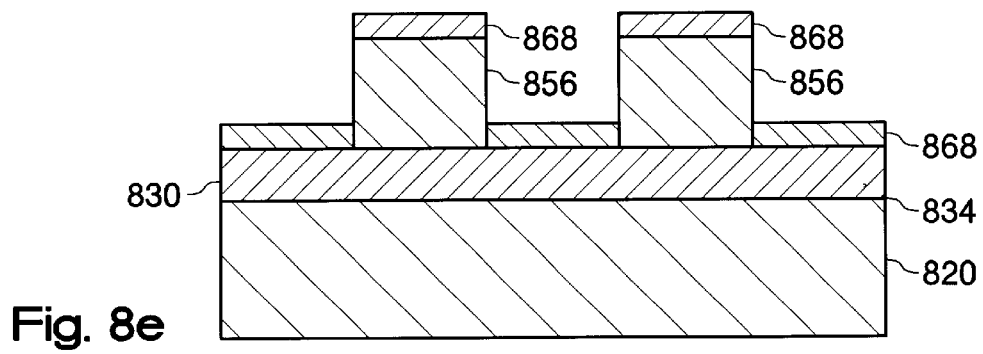
Figure 8F:
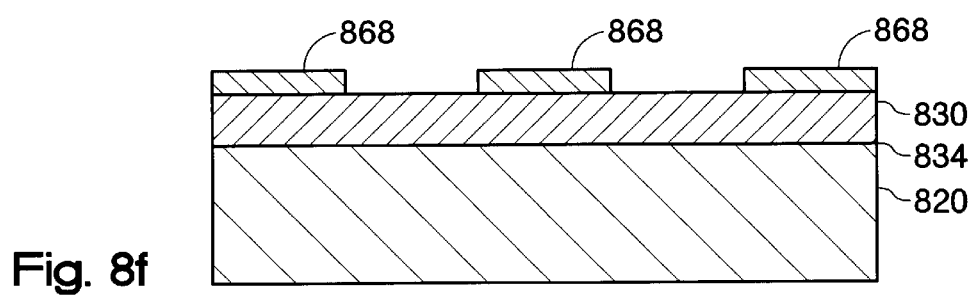

Optional etch mask creating process 689 is utilized to deposit optional etch mask 868 (see FIG. 8e) by depositing a thin metal or dielectric layer over the nanoimprinted surface (see FIG. 8e). For example, when epitaxial semiconducting layer 830 is an epitaxial silicon layer, a two layer etch mask may be utilized by first depositing a diffusion barrier material over the surface over portions of imprinting layer 860 and portions of epitaxial semiconducting layer 830. Subsequently an electrical conductor, such as aluminum, may be deposited. The diffusion barrier may be utilized in those applications where the desired electrical conductor acts as a donor dopant in the epitaxial semiconducting layer, such as aluminum and gold in silicon. The particular material utilized as a diffusion barrier depends on various parameters such as the composition of the epitaxial semiconducting layer, the desired second metal, and the particular etching process used to etch the epitaxial semiconducting layer. In addition, the diffusion barrier and second metal can also be utilized to form electrical contacts to the epitaxial semiconducting layer. Etch mask 868 can be formed from any metal, or dielectric material that provides the appropriate selectivity in etching epitaxial semiconducting layer 830. Etch mask 868 is utilized, in embodiments, where the imprint layer would be damaged or degraded in a later etching process used to etch epitaxial semiconducting layer 830

Optional implant layer removal process 690 is utilized after etch mask 868 (see FIG. 8f) is formed. A selective chemical etch is utilized to remove raised portions 856 (see FIG. 8e) of the imprint layer, causing etch mask material deposited on top of raised portions 856 to be removed. The particular selective chemical etch used will depend on the particular imprint material and etch mask material used. Tetrahydrofuran (THF) may be utilized as a selective etch for PMMA. Other examples of selective chemical etches for PMMA are ethanol water mixtures, and a 1:1 ratio of isopropanol and methyl ethyl ketone used above 25° C. Preferably, acetone at room temperature in an ultrasonic bath is utilized as a selective etch for PMMA followed by an isopropanol rinse. Another example for PMMA, utilizes a methylene chloride soak for about 10 minutes followed by agitating in methylene chloride in an ultrasonic cleaner for about 1 minute. A plasma clean process can also be utilized, in addition to the selective chemical etch, to further clean the exposed epitaxial semiconductor layer surface and the surface of the etch mask.

Figure 8G:
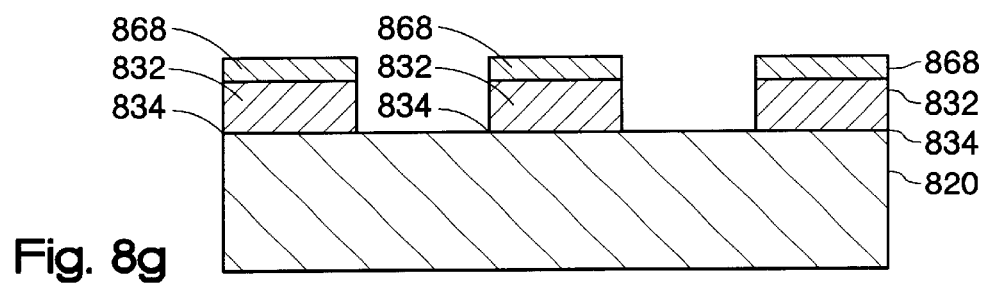

Epitaxial semiconductor layer etching process 691 is utilized to etch epitaxial semiconducting layer 830 in removing those selected areas or portions not protected by etch mask 868 to form epitaxial semiconducting structures 832 (see FIG. 8g). Epitaxial semiconductor layer etching process 691 may be accomplished by any wet or dry etch process appropriate for the particular epitaxial semiconductor material as well as the dopant material used. Depending on the particular epitaxial semiconductor material being etched, as well as the particular application in which the device will be used, the etch profile may extend into the substrate 820. For example, CMOS compatible wet etches include tetramethyl ammonium hydroxide (TMAH), potassium or sodium hydroxide (KOH and NaOH), and ethylene diamine pyrochatechol (EDP). Examples of dry etches that can be utilized are fluorinated hydrocarbon gases ($CF_x$), xenon difluoride ($XeF_2$), and sulfur hexafluoride ($SF_6$).

Figure 8H:
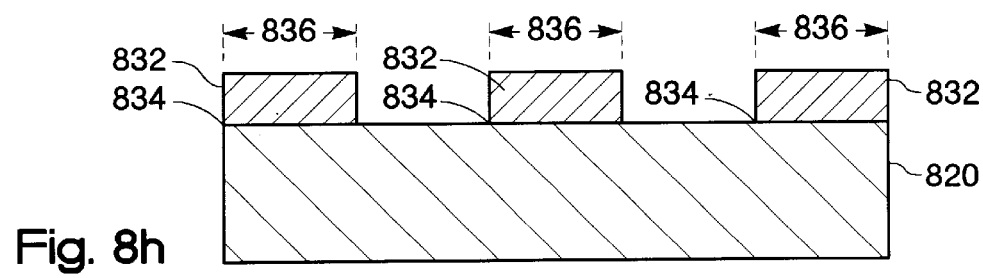

Etch mask removal process 692 is utilized to remove etch mask 868 (see FIG. 8h). Etch mask removal process 692 may be accomplished by any wet or dry etch process appropriate for the particular material utilized for the etch mask. Depending on the particular material utilized in forming etch mask 868 selected portions of the etch mask may be etched using additional nanoimprinting processes forming electrical contacts in the un-etched areas of the epitaxial semiconductor layer. In one embodiment, after removal of the etch mask, epitaxial semiconductor structure 832 forms semiconductor junction 834 having a length (not shown) and width 836 wherein at least one lateral dimension is less than about 75 nanometers. In other embodiments semiconductor junction 834 has an area wherein at least one lateral dimension less than about 50 nanometers. In still other embodiments, junction 834 has an area defined at the interface of less than about 15,000 square nanometers and more preferably less than about 5,000 square nanometers. Epitaxial semiconducting structures 832 and semiconducting junction 834 provide on the order of up to 10 Tera devices/$cm^2$, and depending on the particular application in which the device will be used, the areal density of junctions or diodes, in alternate embodiments, may range from about 0.2 Tera devices/$cm^2$ to about 10.0 Tera devices/$cm^2$.

If the semiconducting structure 832 is to be further processed, to form a bipolar junction transistor, the process proceeds to the processes used to form a polycrystalline semiconductor layer as shown in FIG. 7. Dielectric application process 782 (see FIG. 9a) is utilized to form or deposit planarizing dielectric layer 970 on the surface of the processed substrate (see FIG. 8h) with the epitaxial semiconductor structure 932. Any of a number of inorganic or polymeric dielectrics may be utilized. For example, silicon dioxide deposited using a plasma enhanced chemical vapor deposition process (PECVD) can be utilized. Other materials such as silicon nitride, silicon oxynitride, polyimides, benzocyclobutenes, as well as other inorganic nitrides and oxides may also be utilized. In addition, other silicon oxide films such as tetraethylorthosilicate (TEOS) and other "spin-on" glasses, as well as glasses formed by other techniques may also be utilized. Dielectric Planarizing process 784 is used to planarize planarizing dielectric layer 970 (see FIG.

9b). For example, dielectric planarizing process 784 may utilize mechanical, resist etch back, or chemical mechanical processes, to form substantially planar surface 972 (see FIG. 9b).

Figure 9A:
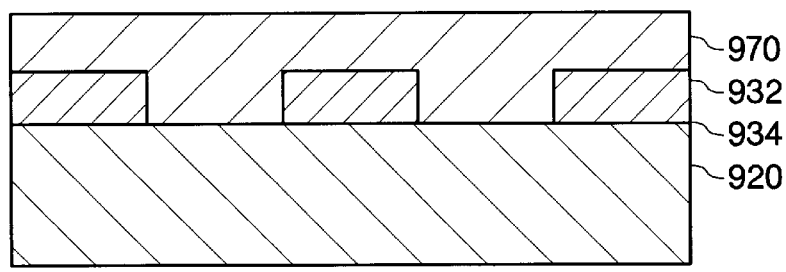
FIGS. 9a–9j are exemplary cross-sectional views of various processes used to create embodiments of the present invention.
Figure 9B:
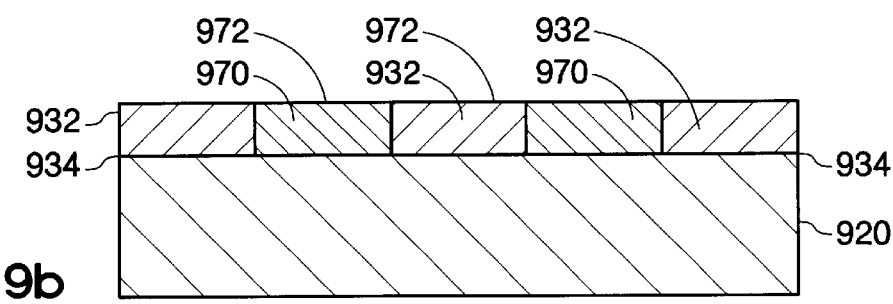
Figure 9C:
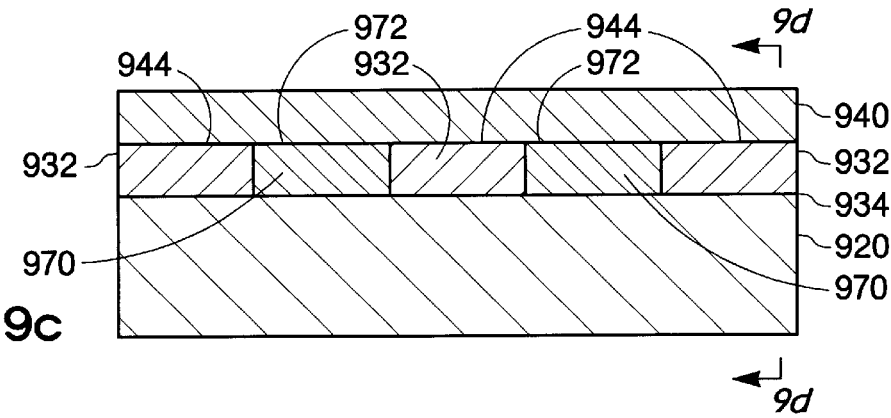

Polycrystalline formation process 785 is utilized to form or create polycrystalline semiconducting layer 940 over semiconducting structures 932 and planarizing dielectric layer 970 on substantially planar surface 972 (see FIG. 9c). Polycrystalline semiconducting layer 940 includes a dopant having the same polarity as the dopant used in semiconductor wafer 920. For those embodiments utilizing a dielectric layer polycrytsalline semiconducting layer 940 includes a dopant of opposite polarity as that used in epitaxial semiconductor structure 932. In addition, for those embodiments utilizing a dielectric layer a third semiconductor layer is utilized to form a bipolar transistor. Such a third semiconductor layer and its corresponding structures may be formed utilizing processes similar to those described herein. Epitaxial semiconductor structure 932 and polycrystalline semiconducting layer 940 (see FIG. 9c) form second semiconductor junction 944. For example, polycrystalline semiconducting layer 940 (see FIG. 9c) is an n or p doped polycrystalline silicon thin film, formed using conventional semiconductor processing equipment.

Figure 9D:
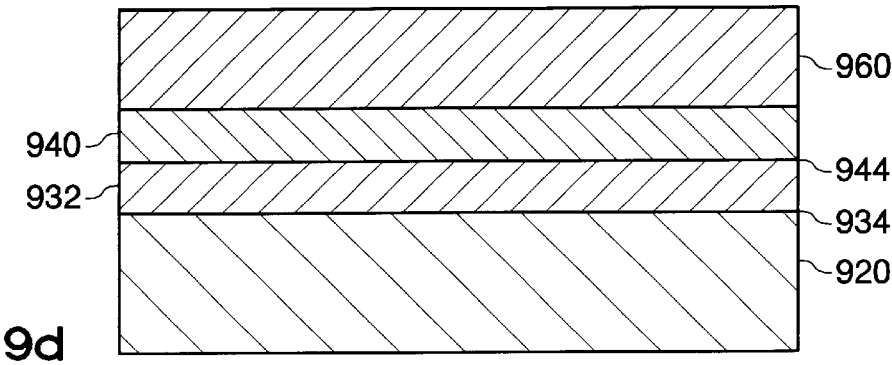

Imprint layer application process 786 is utilized to form or create imprint layer 960 on polycrystalline semiconducting layer 940 (see FIG. 9d). Please note that FIGS. 9d–9j are rotated through ninety degrees compared to FIGS. 9a–9c, however, the structures described in these figures are not limited to this 90 degree angle. Typically, the imprint layer will be the same or similar to that utilized above for creating the epitaxial semiconductor junction utilizing imprint application process 686, however other imprint layer materials may also be utilized. For example, imprint layer 960 (see FIG. 9d) may be a PMMA spin coated film. Imprint layer 960 may be any moldable material applied using any of the techniques discussed above.

Figure 9E:
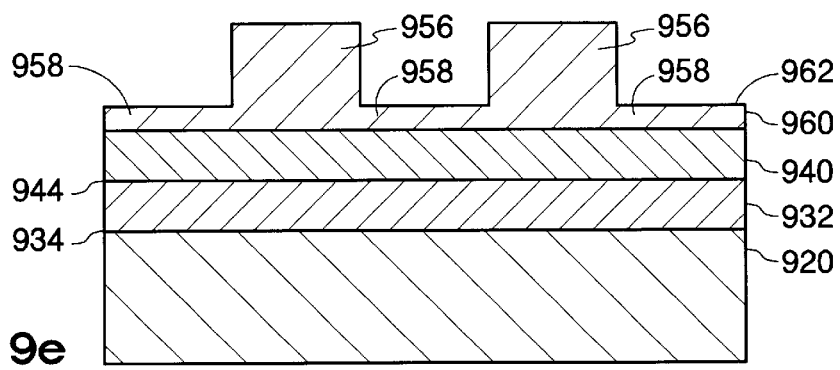

Nanoimprinting process 787 is used; to imprint the desired structures or features into imprint layer 960 (see FIG. 9e). The nanoimprinter (not shown) is pressed or urged toward imprint layer 960 under a condition in which the imprint layer is pliable forming recessed feature 958 and raised feature 956 in imprint layer 960. Both nanoimprinting process 787 as well as the nanoimprinter may be similar to that discussed above in nanoimprinting process 687. For example, heating the PMMA layer, above its softening or glass transition temperature can be utilized.

Figure 9F:
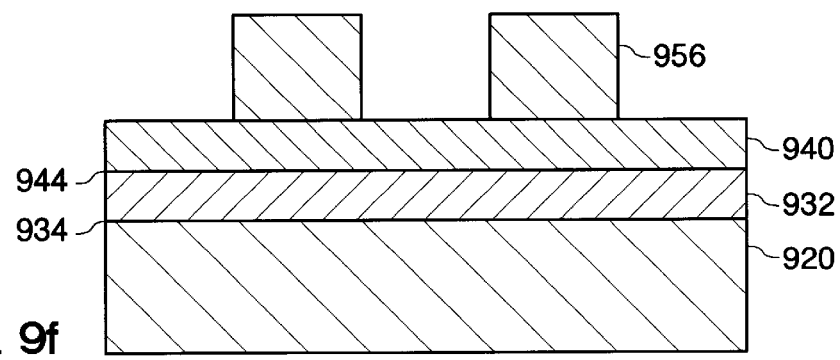

Recessed removing process 788 is utilized to remove recessed features 958 (see FIGS. 9e and 9f formed during nanoimprinting. For example, removal of residual PMMA features 962 that form recessed features 958. Recessed removing process 788 may be accomplished by any wet or dry etch process appropriate for the particular material utilized for the imprint layer as discussed above for process 688.

Figure 9G:
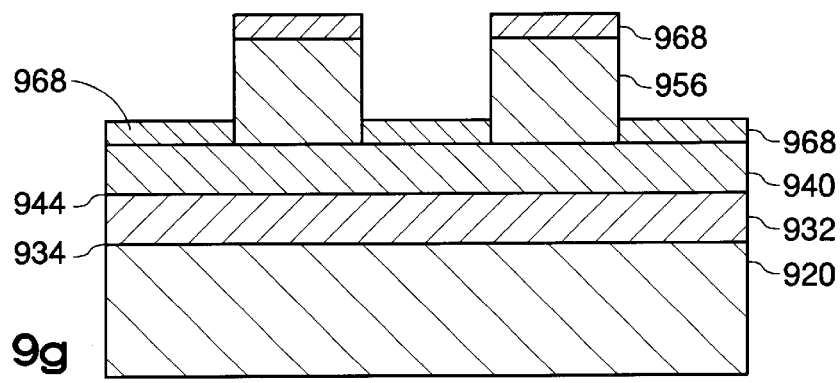

Optional etch mask forming process 789 is utilized to create etch mask 968 by depositing a thin metal layer over the nanoimprinted surface (see FIG. 9g). This process may be accomplished in a similar manner to that discussed above in etch mask forming process 689.

Figure 9H:
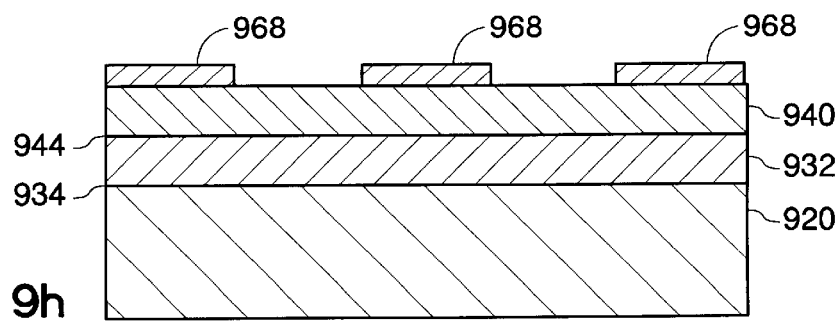
Figure 9I:
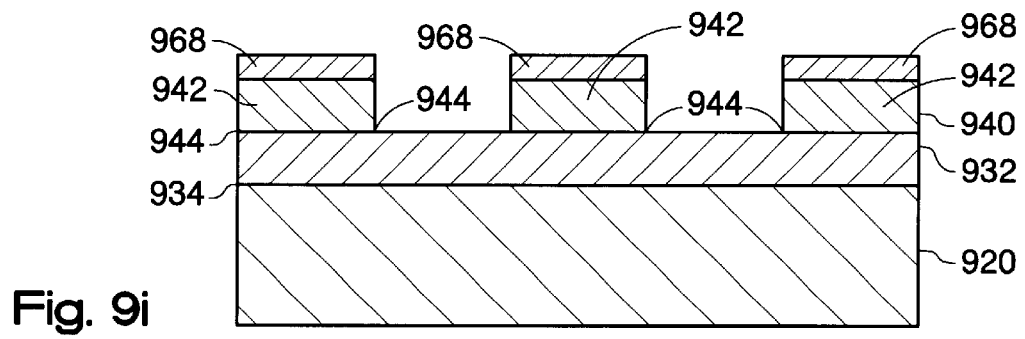

Optional implant layer removal process 790 is utilized to remove raised portions 956 (see FIGS. 9g and 9h). Removal process 790 is performed after etch mask 968 is formed, and may be similar to that described for optional implant layer removal process 690.

Polycrystalline semiconductor etching process 791 is utilized to etch polycrystalline semiconductor layer 940 (see FIG. 9i) in those areas not protected by etch mask 968. Etching process 791 forms polycrystalline semiconducting structures 942. In addition etching process 791 may be accomplished by any wet or dry etch process appropriate for the particular polycrystalline semiconductor material as well as the dopant material used. Etching process 791 may be similar to that described for etching process 691.

Figure 9J:
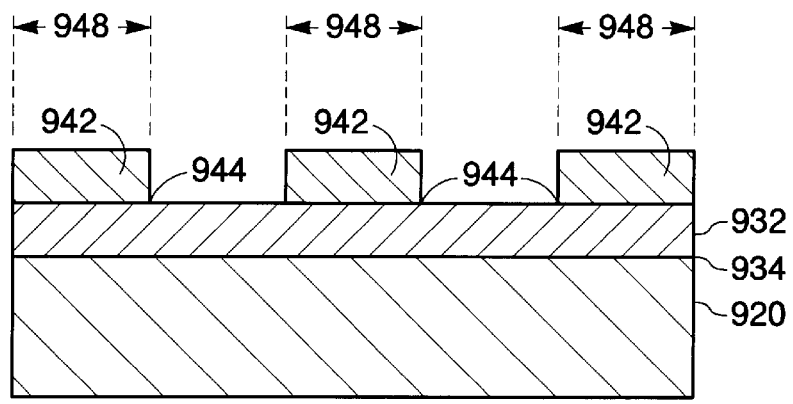

Etch removal process 792 is utilized to remove etch mask 968 as shown in FIG. 9j. Etch mask removal process 792 may be accomplished by any wet or dry etch process appropriate for the particular material utilized for the etch mask as described for removal process 692. Similar to removal process 692, depending on the particular material utilized in forming etch mask 968, selected portions of the etch mask may be etched using additional nanoimprinting processes to form electrical contacts in the un-etched areas of the polycrystalline semiconductor layer. In addition, in alternate embodiments, when etch mask 968 is an appropriate electrically conductive material etch mask 968 can be utilized to form a Schottky barrier to either polycrystalline semiconducting structure 942 or to substrate 920 as well as forming an ohmic contact to a portion of epitaxial semiconducting structure 932. In this embodiment, semiconductor junctions 934 and 944 form a bipolar junction transistor. In addition, semiconductor junction 944 includes an area formed by a length (not shown) and width 948 wherein at least one lateral dimension is less than about 75 nanometers. In alternate embodiments, semiconductor junction 944 has an area wherein at least one lateral dimension is less than about 50 nanometers. In still other embodiments, junction 944 has an area defined at the interface of less than about 15,000 square nanometers and more preferably less than about 5,000 square nanometers. Semiconducting junction 944 provides on the order of 10 Tera devices/cm$^2$, and depending on the particular application in which the device will be used, the areal density of transistors or devices, in alternate embodiments, may range from about 0.2 Tera devices/cm$^2$ to about 10.0 Tera devices/cm$^2$.

Figure 10:
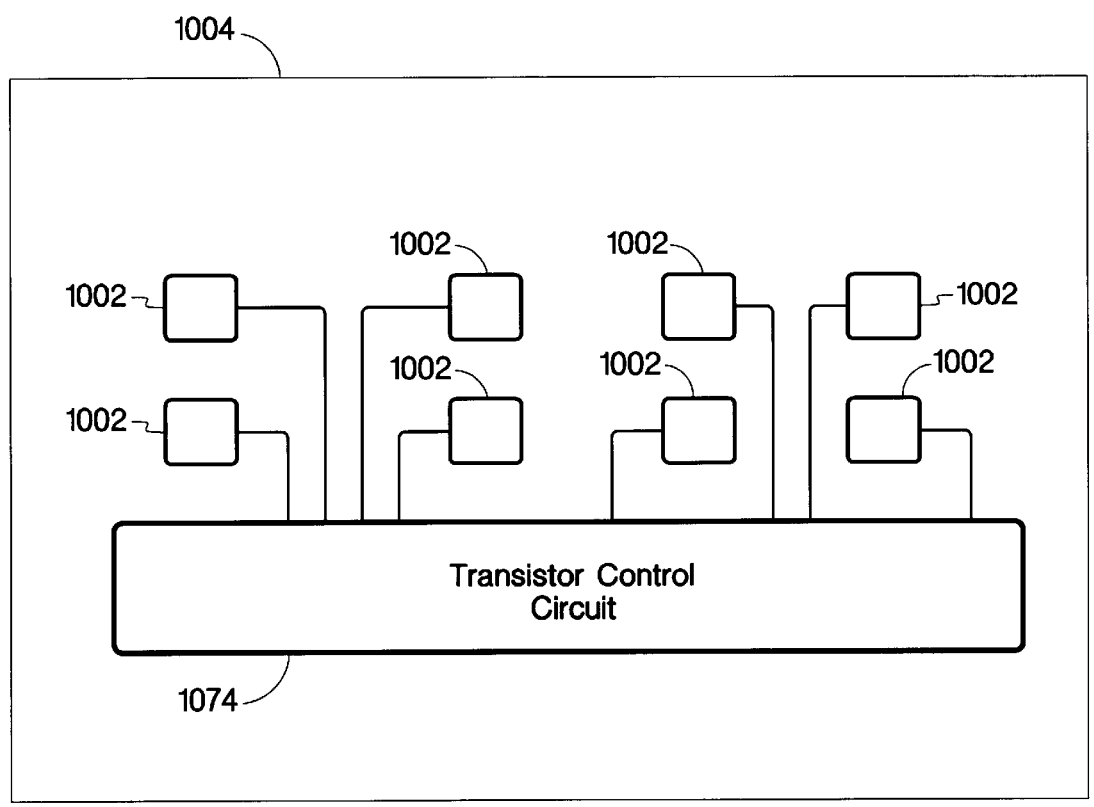
FIG. 10 is block diagram of a semiconductor device incorporated in an integrated circuit with control circuitry according to an alternate embodiment of the present invention.

Referring to FIG. 10 an exemplary embodiment of the present invention in the form of an integrated circuit 1004 that has one or more bipolar junction transistors 1002 arranged in an array and controlled by transistor control circuitry 1074. The transistor control circuit 1074 allows individual control of each bipolar junction transistor 1002. Although FIG. 10 shows only one connection between transistor control circuitry 1074 and transistor 1002 other connections may be made depending on the particular application in which integrated circuit 1004 will be utilized. Integrated circuit 1004 may be fabricated with conventional CMOS, BiCMOS, or custom CMOS/HVCMOS circuitry. The ability to couple the present invention with the use of conventional semiconductor processes the cost is lowered and the ability to mass-produce combined nanoscale devices and circuitry is possible.

Figure 11:
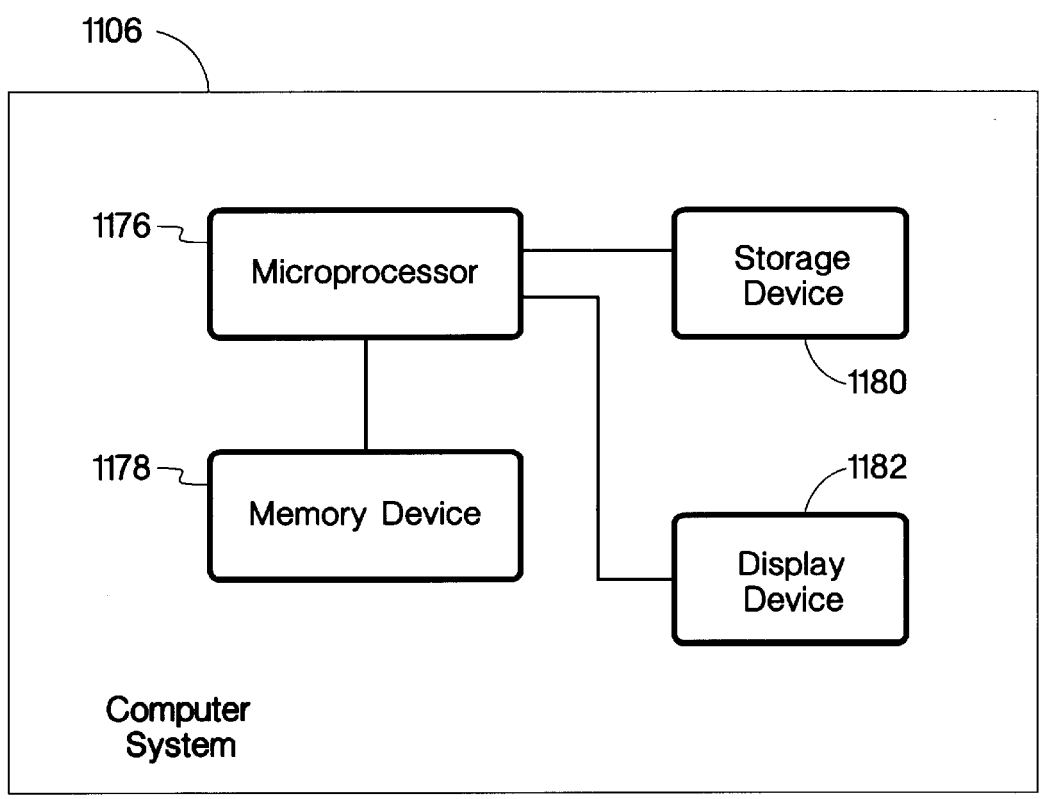
FIG. 11 is a block diagram of an alternate embodiment of the present invention incorporated into an electronic device.

Referring to FIG. 11 an exemplary block diagram of an electronic device 1106, such as a computer system, video game, Internet appliance, terminal, MP3 player, cellular phone, or personal digital assistant to name just a few. Electronic device 1106 includes microprocessor 1176, such as an Intel processor sold under the name "Pentium Processor," or compatible processor. Many other processors exist and may also be utilized. Microprocessor 1176 is electrically coupled to a memory device 1178 that includes processor readable memory that is capable of holding computer executable commands or instructions used by the microprocessor 1176 to control data, input/output functions, or both. Memory device 1178 may also store data that is manipulated by microprocessor 1176. Microprocessor 1176 is also electrically coupled either to storage device 1180, or display device 1182 or both. Microprocessor 1176, memory device 1178, storage device 1180, and display device 1182 each may contain an embodiment of the present invention as exemplified in earlier described figures and text showing semiconductor junctions, diodes, and bipolar junction transistors that have an area wherein at least one lateral dimension is less than about 75 nanometers. In alternate embodiments, such junctions have an area wherein at least one lateral dimension is less than about 50 nanometers. In still other embodiments, the junctions have an area defined at the interface of less than about 15,000 square nanometers and more preferably less than about 5,000 square nanometers. Such devices provide on the order of 10 Tera devices/$cm^2$, and depending on the particular application in which the device will be used, the areal density of transistors or devices, in alternate embodiments, may range from about 0.2 Tera devices/$cm^2$ to about 10.0 Tera devices/$cm^2$.

What is claimed is:

1. A method for forming nanoscale semiconductor junctions comprising:

creating an epitaxial semiconducting layer including a dopant of a first polarity formed on a semiconductor substrate having a dopant of a second polarity;

creating an imprint layer on said epitaxial semiconducting layer;

urging a nanoimprinter toward said imprint layer;

removing selective portions of said epitaxial semiconducting layer forming an epitaxial semiconducting structure having an area with at least one lateral dimension less than about 75 nanometers;

creating a dielectric layer over said epitaxial semiconducting structure;

planarizing said dielectric layer to substantially the same thickness as said epitaxial semiconducting structure;

creating a polycrystalline semiconducting layer including a dopant of said second polarity over said epitaxial semiconducting layer and said dielectric layer;

removing selective portions of said polycrystalline semiconducting layer, and forming a polycrystalline semiconducting structure having an area with at least one lateral dimension less than about 75 nanometers.

2. A bipolar junction transistor created by the method of claim 1.

3. A method for forming nanoscale semiconductor junctions comprising:

creating an imprint layer on an epitaxial semiconducting layer, said epitaxial semiconducting layer having a dopant of a first polarity and disposed over a substrate;

urging a nanoimprinter toward said imprint layer;

removing selective portions of said epitaxial semiconducting layer;

forming an epitaxial semiconducting structure having an area with at least one lateral dimension less than about 75 nanometers; and forming a first semiconducting junction utilizing said epitaxial semiconducting structure, said first semiconducting junction having an area with at least one lateral dimension less than about 75 nanometers.

4. The method in accordance with claim 3, further comprising creating said epitaxial semiconducting layer on a complementary doped semiconductor substrate, wherein said epitaxial semiconducting layer includes a dopant of a first polarity.

5. The method in accordance with claim 4, further comprising creating a dielectric layer between said substrate and said epitaxial semiconducting layer.

6. A bipolar junction transistor created by the method of claim 3.

7. The method in accordance with claim 3, further comprising:

creating a first planarizing dielectric layer over said epitaxial semiconducting structure;

co-planarizing said first planarizing dielectric layer to substantially the same thickness as said epitaxial semiconductor structure;

creating a second semiconducting layer including a dopant of a second polarity over said epitaxial semiconducting layer and said first planarizing dielectric layer;

creating a second imprint layer on said second semiconducting layer;

urging a nanoimprinter toward said second imprint layer;

removing selective portions of said second semiconducting layer; and forming a second semiconducting structure having an area having at least one lateral dimension less than about 75 nanometers.

8. The method in accordance with claim 7, further comprising forming a second semiconducting junction having an area having at least one lateral dimension less than about 75 nanometers.

9. A bipolar junction transistor created by the method of claim 7.

10. The method in accordance with claim 7, wherein creating a second semiconducting layer further comprises creating a doped polysilicon layer.

11. The method in accordance with claim 7, wherein forming said epitaxial semiconductor structure further comprises forming a plurality of epitaxial semiconducting lines substantially parallel to each other, and forming said second semiconducting structure further comprises forming a plurality of second semiconducting lines substantially parallel to each other, and at a predetermined angle to said plurality of epitaxial semiconducting lines.

12. The method in accordance with claim 3, further comprises removing a recessed portion.

13. The method in accordance with claim 3, further comprises creating an etch mask over portions of said imprinting layer and portions of said epitaxial semiconducting layer.

14. The method in accordance with claim 13, further comprising removing said etch mask.

15. The method in accordance with claim 13, wherein creating said etch mask further comprises:

creating a diffusion barrier over portions of said imprinting layer and portions of said epitaxial semiconducting layer; and creating and electrically conductive layer over said diffusion barrier.

16. The method in accordance with claim 13, further comprising forming an electrical contact to said epitaxial semiconducting layer utilizing said diffusion barrier and said electrically conductive layer.

17. The method in accordance with claim 3, further comprising removing said implant layer.

18. The method in accordance with claim 17, further comprising plasma cleaning an exposed surface of said epitaxial semiconducting layer.

19. The method in accordance with claim 3, wherein said urging a nanoimprinter further comprises heating said implant layer.

20. The method in accordance with claim 3, further comprising etching said epitaxial semiconducting layer.

21. The method in accordance with claim 3, wherein creating said imprinting layer further comprises depositing said imprinting layer utilizing inkjet deposition.

22. A method for forming nanoscale junctions comprising:

creating a doped epitaxial silicon layer, which has a thickness less than about 75 nanometers, on a doped silicon wafer;

creating an imprint layer on said doped epitaxial silicon layer urging a nanoimprinter toward an imprint layer removing selective portions of said doped epitaxial silicon layer;

forming a semiconductor-junction between said doped silicon wafer and said epitaxial silicon layer having an area with at least one lateral dimension less than about 75 nanometers;

forming a planarizing dielectric layer over said doped epitaxial silicon structure;

planarizing said planarizing dielectric layer to substantially the same thickness as said doped epitaxial silicon structure, creating a second semiconducting layer over said epitaxial silicon structure and said planarizing dielectric layer, said semiconducting layer having a dopant opposite in polarity to said epitaxial silicon layer, creating an imprint layer on said second semiconducting layer urging a nanoimprinter toward a second imprint layer;

removing selective portions of said second semiconducting layer; and forming a second semiconductor junction between said doped epitaxial layer and said second semiconducting layer having an area with at least one lateral dimension less than about 75 nanometers.

* * * * *

UNITED STATES PATENT AND TRADEMARK OFFICE
CERTIFICATE OF CORRECTION

PATENT NO.    : 6,762,094 B2
DATED         : July 13, 2004
INVENTOR(S)   : Stasiak et al.

It is certified that error appears in the above-identified patent and that said Letters Patent is hereby corrected as shown below:

Column 11,
Line 55, delete "830" and insert therefor -- 830. --

Column 15,
Lines 22 and 51, delete "tions" and insert therefor -- tions, --.
Lines 31 and 44, delete "layer" and insert therefor -- layer; --

Column 17,
Line 9, delete "junctions" and insert therefor -- junctions, --.
Line 16, delete "layer" and insert therefor -- layer; --.
Line 17, delete "an" and insert therefor -- said --.
Line 17, delete "layer" and insert therefor -- layer; --.
Line 20, delete "semiconductor-junction" and insert therefor -- semiconductor junction --.

Column 18,
Line 6, delete "structure," and insert therefor -- structure; --.
Line 9, after "said", insert -- second --.
Line 10, delete "layer," and insert therefor -- layer; --.
Line 11, delete "an" and insert therefor -- a second --.
Line 12, delete "layer" and insert therefor -- layer; --.
Line 14, delete the second "a" and insert therefor -- said --.

Signed and Sealed this

First Day of February, 2005

JON W. DUDAS
*Director of the United States Patent and Trademark Office*